(12) United States Patent
Eiji

(10) Patent No.: US 11,490,522 B2
(45) Date of Patent: Nov. 1, 2022

(54) METHOD FOR MANUFACTURING WIRING BOARD OR WIRING BOARD MATERIAL

(71) Applicant: DAIWA CO., LTD., Nagano (JP)

(72) Inventor: Yoshimura Eiji, Nagano (JP)

(73) Assignee: DAIWA CO., LTD., Nagano (JP)

( * ) Notice: Subject to any disclaimer, the term of this patent is extended or adjusted under 35 U.S.C. 154(b) by 988 days.

(21) Appl. No.: 16/078,504

(22) PCT Filed: Feb. 17, 2017

(86) PCT No.: PCT/JP2017/005924
§ 371 (c)(1),
(2) Date: Aug. 21, 2018

(87) PCT Pub. No.: WO2017/145936
PCT Pub. Date: Aug. 31, 2017

(65) Prior Publication Data
US 2021/0195755 A1    Jun. 24, 2021

(30) Foreign Application Priority Data

Feb. 22, 2016  (JP) .............................. JP2016-031180
Apr. 28, 2016  (JP) .............................. JP2016-090098
Nov. 17, 2016  (JP) .............................. JP2016-223970

(51) Int. Cl.
*H05K 3/02*       (2006.01)
*H05K 3/40*       (2006.01)
(Continued)

(52) U.S. Cl.
CPC .............. *H05K 3/025* (2013.01); *H05K 1/11* (2013.01); *H05K 3/0058* (2013.01); *H05K 3/26* (2013.01);
(Continued)

(58) Field of Classification Search
CPC ................. H05K 3/025; H05K 3/0058; H05K 2203/0152; H05K 2203/0156; H05K 3/40;
(Continued)

(56) References Cited

U.S. PATENT DOCUMENTS 5,227,588 A * 7/1993 Schreiber ............. H05K 3/4038
174/262
7,059,039 B2 * 6/2006 Tsukamoto .... H05K 2203/0152
156/272.2

(Continued)

FOREIGN PATENT DOCUMENTS

DE   102015200031 A1   7/2015
JP   2004-179309 A     6/2004
(Continued)

OTHER PUBLICATIONS

T. Shimoto, K. Matsui, Y. Shimada and K. Utsumi, "New high-density multilayer technology on PCB," 1998 Proceedings. 48th Electronic Components and Technology Conference (Cat. No.98CH36206), 1998, pp. 158-164, doi: 10.1109/ECTC.1998.678686. (Year: 1998).*

(Continued)

*Primary Examiner* — A. Dexter Tugbang
(74) *Attorney, Agent, or Firm* — Calfee, Halter & Griswold LLP

(57) ABSTRACT

Provide are a method for manufacturing a wiring board or a wiring board material, and the wiring board obtained by the method, which allows columnar metal members to be inserted into the wiring board at once using a simple operation, enables alignment without requiring strict accuracy, can handle columnar metal members having different shapes, and imparts sufficiently high adhesive strength to the columnar metal members.

(Continued)

The method includes the steps of: laminating a laminate material LM including the support sheet 10 having the columnar metal members 14 formed thereon, a wiring board WB or a wiring board material WB' having a plurality of openings in portions corresponding to the columnar metal members 14, and a prepreg 16' having a plurality of openings in portions corresponding to the columnar metal members 14 and containing a thermosetting resin such that the columnar metal members 14 are positioned in the respective openings; integrating the laminate material LM by heating and pressing to obtain a laminate LB including a thermosetting resin filled between an inner surface of each of the openings of the wiring board WB or the wiring board material WB' and each of the columnar metal members 14; and peeling at least the support sheet 14 from the laminate LB.

2 Claims, 12 Drawing Sheets

(51) Int. Cl.
  *H05K 1/11* (2006.01)
  *H05K 3/00* (2006.01)
  *H05K 3/26* (2006.01)
(52) U.S. Cl.
  CPC ............. *H05K 3/40* (2013.01); *H05K 3/4038* (2013.01); *H05K 2203/0152* (2013.01); *H05K 2203/0156* (2013.01); *H05K 2203/0169* (2013.01); *Y10T 29/49115* (2015.01)
(58) Field of Classification Search
  CPC ......... H05K 2203/0169; H05K 3/4038; H05K 1/11; H05K 3/26; Y10T 29/49165
  See application file for complete search history.

(56) References Cited

U.S. PATENT DOCUMENTS

| | | |
|---|---|---|
| 2004/0156175 A1 | 8/2004 | Nakamura et al. |
| 2006/0162956 A1* | 7/2006 | Nakamura ........ Y10T 29/49165 |
| | | 174/255 |
| 2006/0286301 A1 | 12/2006 | Murata et al. |
| 2010/0326714 A1 | 12/2010 | Fukuzono |
| 2016/0284659 A1 | 9/2016 | Chen et al. |

FOREIGN PATENT DOCUMENTS

| | | | |
|---|---|---|---|
| JP | 2005-51088 A | | 2/2005 |
| JP | 2006-156610 A | | 6/2006 |
| JP | 2007103440 A | * | 4/2007 |
| JP | 2009-170493 A | | 7/2009 |
| JP | 2010-62199 A | | 3/2010 |
| JP | 2011-15977 A | | 8/2011 |
| JP | 2015-133373 | | 7/2015 |
| JP | 2015185671 A | | 10/2015 |
| KR | 1020090043818 A | | 5/2009 |
| TW | I263287 B | | 10/2006 |
| TW | M512215 U | | 11/2015 |
| WO | 2013125033 A1 | | 8/2013 |

OTHER PUBLICATIONS

English Translation of Written Opinion of the International Searching Authority Report from International Application No. PCT/JP2017/005924 dated Sep. 7, 2018 (10 pages).
English Translation of International Search Report from International Application No. PCT/JP2017/005924 dated Apr. 25, 2017 (2 pages).
Examination Report of Taiwan Patent Application No. 106105519 dated Dec. 11, 2020.
Search Report from European Patent Application No. 17756375.6 dated Oct. 9, 2019.
Notice of Reasons For Refusal for Japanese Patent Application No. 2016-223970 dated Mar. 13, 2020.

* cited by examiner

Fig.5
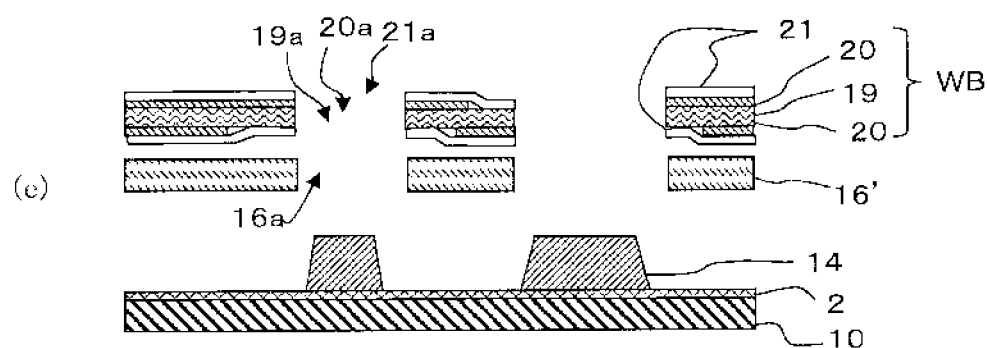
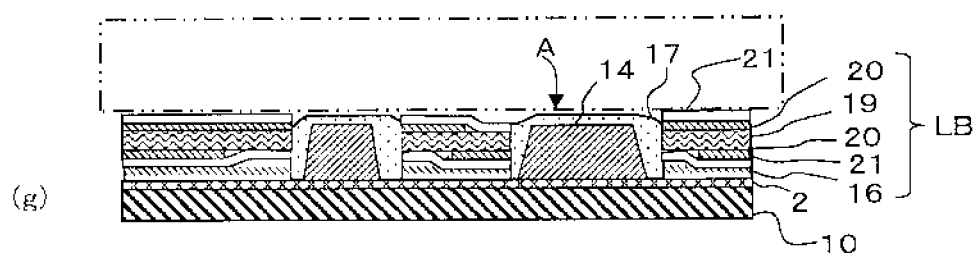
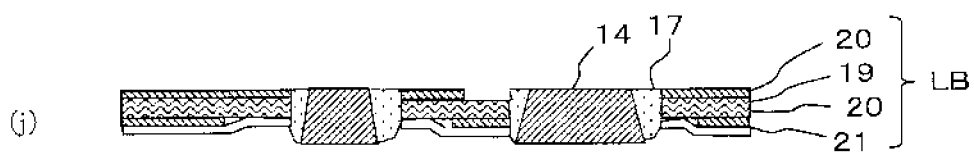
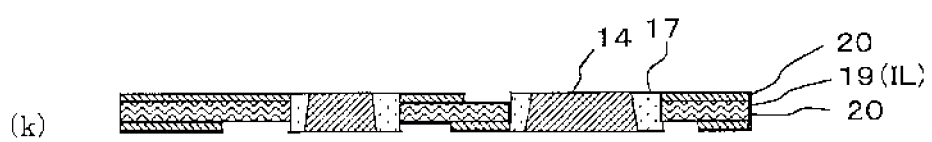

Fig.7
(a) 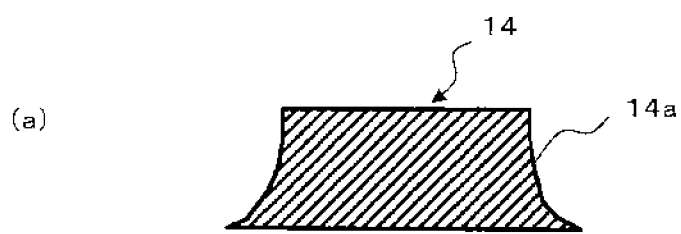
(b) 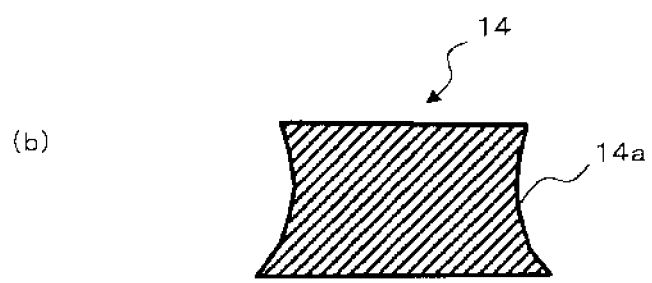

Fig.9
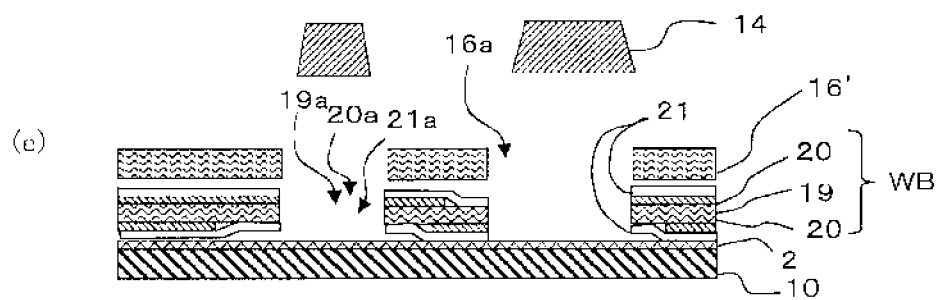
(e)
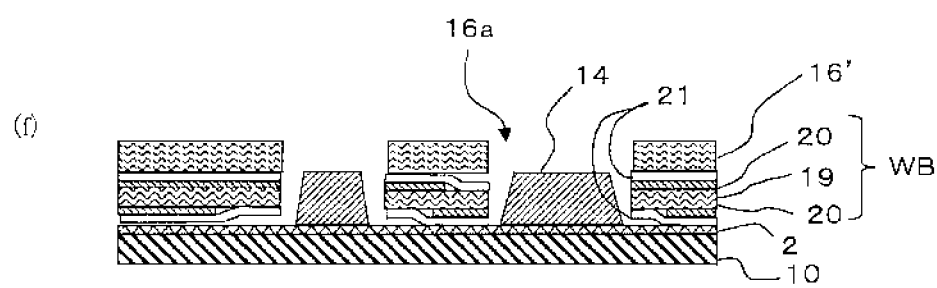
(f)
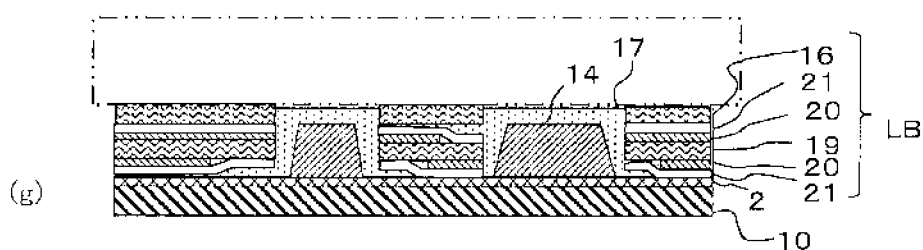
(g)
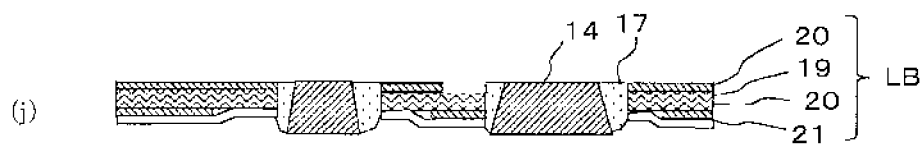
(j)
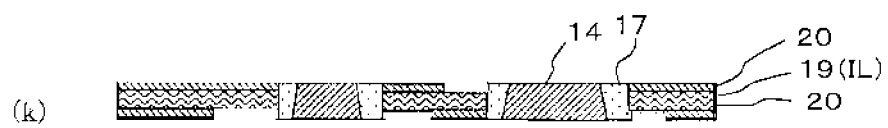
(k)

METHOD FOR MANUFACTURING WIRING BOARD OR WIRING BOARD MATERIAL

CROSS REFERENCE TO RELATED APPLICATION

This application is a 371 of International Application No. PCT/JP2017/005924, filed on Feb. 17, 2017, which is based upon and claims a priority to Japanese Patent Application No. 2016-031180, filed on Feb. 22, 2016, Japanese Patent Application No. 2016-090098, filed on Apr. 28, 2016, and Japanese Patent Application No. 2016-223970, filed on Nov. 17, 2016 the entire contents of which are incorporated herein by reference.

TECHNICAL FIELD

The present invention relates to a method for manufacturing a wiring board or a wiring board material in which columnar metal members are embedded in the wiring board, and the wiring board obtained by the method. The wiring board is useful as a board used for an inverter device and an LED board and the like and having excellent heat dissipation properties.

BACKGROUND ART

There has been known a method for dissipating heat from the back face of a wiring board in order to suitably cool heat-generating components such as electronic components (such as LED and QFN (Quad For Non-Lead Package)) mounted on the wiring board. For example, there has been known a heat dissipation structure in which a metal plate (heat dissipation terminal) provided on the lower surface of a heat-generating component is soldered to a land of a mounting surface of a wiring board, to dissipate heat to the back face side of the wiring board through the land and a plated through hole. In order to further improve heat dissipation properties to the back face side, there has been known a method for soldering a heat dissipating terminal of a heat-generating component on coin-like copper (copper inlay) employed in place of a plated through hole.

As a technique related to a wiring board including such a copper inlay, a wiring board disclosed in the following patent document 1 has been known. On the wiring board, a heat-transfer member is press-fitted into a portion on which a heat-generating component is mounted, and a large diameter portion is formed on the press-fit side peripheral edge of a fit hole into which the heat-transfer member is fitted. The heat-transfer member includes a flange portion engaging with the large diameter portion in the press-fitted state. As a result, the fitting depth of the heat-transfer member can be easily kept constant without strictly managing the press-fitting force of the heat-transfer member with respect to the fit hole, whereby the press-fitting accuracy of the heat-transfer member and the press-fitting workability are improved.

The following Patent Document 2 proposes a solder joint in which a heat-transfer member corresponding to a copper inlay and covered with a solder is inserted into a plated through hole. Thus, the utilization of the solder joint makes it possible to provide a structure in which the heat-transfer member is less likely to come off.

PRIOR ART DOCUMENTS

Patent Document

Patent Document 1: JP-A-2009-170493
Patent Document 2: JP-A-2015-133373

SUMMARY OF THE INVENTION

Problems to be Solved by the Invention

However, in the structures of the boards described in Patent Documents 1 and 2, the copper inlay is inserted into the through hole, which disadvantageously causes high accuracy required for alignment, and a complicated insertion process. A press-fitting device for automation is used when the copper inlay is inserted, which makes it necessary to use the copper inlay having the same shape, whereby the degree of freedom in designing the copper inlay is decreased.

The structure of Patent Document 2 increases the joining strength of the heat-transfer member, but it makes it necessary to coat each heat-transfer member with a solder and the like, and to improve the accuracy of the thickness to be coated, whereby the structure of Patent Document 2 cannot be said to have high productivity.

It is an object of the present invention to provide a method for manufacturing a wiring board or a wiring board material, and the wiring board obtained by the method, which allows columnar metal members to be inserted into the wiring board at once using a simple operation, enables alignment without requiring strict accuracy, can handle columnar metal members having different shapes, and imparts sufficiently high adhesive strength to the columnar metal members.

Means for Solving the Problems

The above object of the present invention can be achieved by the present invention as follows.

That is, a method for manufacturing a wiring board or a wiring board material according to the present invention, the method including the steps of: preparing a laminate material including a support sheet having a plurality of columnar metal members formed thereon, and a wiring board or a wiring board material having a plurality of openings in portions corresponding to the columnar metal members such that the columnar metal members are positioned in the respective openings; obtaining a laminate including a thermosetting resin filled and cured between an inner surface of each of the openings of the wiring board or the wiring board material and each of the columnar metal members; and peeling at least the support sheet from the laminate.

The method for manufacturing a wiring board or a wiring board material of the present invention uses the laminate material in which the columnar metal members are positioned in the respective openings of the wiring board or the wiring board material, and fills and cures the thermosetting resin between the inner surface of each of the openings and each of the columnar metal members, whereby the columnar metal members can be inserted into the wiring board at once using a simple operation, and the wiring board or the wiring board material imparting sufficiently high adhesive strength to the columnar metal members is obtained. At that time, a gap is present between the inner surface of each of the openings and each of the columnar metal members, whereby alignment is not required with strict accuracy, and the shapes of the openings and the columnar metal members in plan view can be freely determined, which can also handle the case where the plurality of columnar metal members have different shapes.

Another method for manufacturing a wiring board or a wiring board material of the present invention, the method including the steps of: forming a plurality of columnar metal members on a support sheet; laminating a laminate material including the support sheet having the columnar metal members formed thereon, a wiring board or a wiring board material having a plurality of openings in portions corresponding to the columnar metal members, and a prepreg having a plurality of openings in portions corresponding to the columnar metal members and containing a thermosetting resin such that the columnar metal members are positioned in the respective openings; integrating the laminate material by heating and pressing to obtain a laminate including a thermosetting resin filled between an inner surface of each of the openings of the wiring board or the wiring board material and each of the columnar metal members; and peeling at least the support sheet from the laminate.

The method for manufacturing a wiring board or a wiring board material of the present invention uses the wiring board or the wiring board material having the plurality of openings in portions corresponding to the columnar metal members, and integrates the wiring board or the wiring board material with the support sheet having the columnar metal members formed thereon, whereby the columnar metal members can be inserted into the wiring board at once using a simple operation. At this time, the openings each having a space in which the thermosetting resin is filled are formed later, whereby alignment is not required with strict accuracy, and the opening according to the shape of each of the columnar metal members can be formed, which can also handle the columnar metal members having different shapes. In addition, the thermosetting resin is filled between the inner surface of each of the openings and each of the columnar metal members by integrating provided by heating and pressing, whereby the wiring board imparting sufficiently high adhesive strength to the columnar metal members is obtained.

In the method, the step of forming the columnar metal members is preferably the step of etching a metal plate adhering to the support sheet to form the plurality of columnar metal members. The method can determine an etching pattern (a position of a mask and the like) according to positions into which the columnar metal members are inserted based on the design information of the wiring board when the metal plate adhering to the support sheet is etched, and flexibly handle the columnar metal members having different shapes. In addition, the columnar metal member formed by etching includes a peripheral wall curved in a longitudinal sectional shape (peripheral wall and the like having a divergent shape), whereby the contact area is increased as compared with one having the peripheral wall which is a straight line in the longitudinal sectional shape, which can provide further increased adhesive strength between each of the metal members and the thermosetting resin.

It is preferable that the laminate material includes the plurality of wiring boards or wiring board materials and the prepreg interposed therebetween. Thus, by interposing the prepreg therebetween, the prepreg can be used as it is without peeling the prepreg. The prepreg is integrated with the oozing-out thermosetting resin, whereby the adhesive strength provided by the thermosetting resin can be further increased.

At that time, it is preferable that the laminate material includes the prepreg and a single-sided metal-clad laminate plate which includes a metal layer disposed on each of both sides of the prepreg such that the metal layer is positioned on the outside and has a plurality of openings in portions corresponding to the columnar metal members. The single-sided metal-clad laminate plate, which is the wiring board material, is a general-purpose material, and has high adhesion properties to a prepreg, which can provide a double-sided metal-clad laminate into which the columnar metal members are inserted. This can be further plated with a metal or patterned to manufacture a wiring board.

Alternatively, the laminate material may include the prepreg interposed between the wiring board or the wiring board material and the support sheet; and the method may further include the step of peeling the prepreg from the laminate. Even in such a laminate material, the thermosetting resin is filled between the inner face of each of the openings and each of the columnar metal members by integrating provided by heating and pressing, whereby a wiring board imparting sufficiently high adhesive strength to the columnar metal members is obtained.

Furthermore, the laminate material may include the prepreg on the wiring board or the wiring board material; and the method may further include the step of peeling the prepreg from the laminate. Even in such a laminate material, the thermosetting resin is filled between the inner face of each of the openings and each of the columnar metal members by integrating provided by heating and pressing, whereby a wiring board imparting sufficiently high adhesive strength to the columnar metal members is obtained.

It is preferable that the laminate material includes a resin film which adheres to a surface of the wiring board or the wiring board material and has a plurality of openings in portions corresponding to the columnar metal members; and the method further includes the step of peeling the resin film from the laminate. The use of such a resin film makes it possible to prevent the prepreg from adhering to the surface of the wiring board to be less likely to peel the prepreg.

Furthermore, it is preferable that the method further includes the step of chemically and/or physically surface-treating the columnar metal members using the support sheet having the columnar metal members formed thereon. Such a surface treatment makes it possible to further increase the adhesive force between the periphery of each of the columnar metal members and the thermosetting resin.

A plated through hole may be formed in each of the openings of the wiring board or the wiring board material. In this case, the thermosetting resin is filled and cured between the inner surface of the plated through hole and each of the columnar metal members.

On the other hand, a wiring board of the present invention having an opening, the wiring board including; a columnar metal member positioned in the opening; and a thermosetting resin filled and cured between an inner surface of the opening and the columnar metal member. The wiring board of the present invention has a structure in which the thermosetting resin is filled and cured between the inner surface of the opening of the wiring board and the columnar metal member, which allows the columnar metal members to be inserted into the wiring board at once using a simple operation, does not require alignment with strict accuracy, can handle the columnar metal members having different shapes, and imparts sufficiently high adhesive strength to the columnar metal members.

In the wiring board, a plated through hole may be formed in the opening of the wiring board. In this case, the thermosetting resin is filled and cured between the inner surface of the plated through hole and each of the columnar metal members.

Another wiring board according to the present invention including: an insulating layer; a columnar metal member embedded in the insulating layer; and a wiring layer, wherein: the insulating layer includes a cured product of a prepreg; and a thermosetting resin oozing out from the prepreg causes a periphery of the columnar metal member to adhere to the insulating layer.

In the wiring board of the present invention, the thermosetting resin oozing out from the prepreg causes the periphery of the columnar metal member to adhere to the insulating layer, which allows the columnar metal members to be inserted into the wiring board at once using a simple operation, does not require alignment with strict accuracy, can handle the columnar metal members having different shapes, and imparts sufficiently high adhesive strength to the columnar metal members.

Another wiring board according to the present invention including: an insulating layer; a columnar metal member embedded in the insulating layer; and a wiring layer, wherein a thermosetting resin different from a resin component of the insulating layer causes a periphery of the columnar metal member to adhere to the insulating layer. Thus, the thermosetting resin different from the resin component of the insulating layer derived from the prepreg causes the periphery of the columnar metal member to adhere to the insulating layer, which allows the columnar metal members to be inserted into the wiring board at once using a simple operation, does not require alignment with strict accuracy, can handle the columnar metal members having different shapes, and imparts sufficiently high adhesive strength to the columnar metal member.

In the wiring board, it is preferable that the columnar metal member includes a peripheral wall curved in a longitudinal sectional shape. Such a peripheral wall increases the contact area as compared with one having a peripheral wall which is a straight line in the longitudinal sectional shape, whereby the adhesive strength between the columnar metal member and the thermosetting resin can be further increased.

It is preferable that the wiring layer includes a pattern portion extending on at least one surface of the columnar metal member. Such a pattern portion can more firmly bond the columnar metal member embedded in the insulating layer.

BRIEF DESCRIPTION OF THE DRAWINGS

FIG. 5 is a cross-sectional view showing an example of another embodiment in a method for manufacturing a wiring board or a wiring board material of the present invention.

FIG. 7 is a cross-sectional view showing an example of a columnar metal member in the present invention.

FIG. 8 is a view showing an example of a method for forming a columnar metal member according to the present invention, wherein: FIG. 8(*a*) is a perspective view showing the shape of a metal plate after etching; FIG. 8(*b*) is a perspective view showing a state where the metal plate is peeled; and FIG. 8(*c*) is a cross-sectional view showing the obtained columnar metal member.

FIG. 9 is a cross-sectional view showing an example of steps of another embodiment for manufacturing a wiring board of the present invention.

MODE FOR CARRYING OUT THE INVENTION

Embodiments of the present invention will be described below with reference to the drawings. A method for manufacturing a wiring board or a wiring board material of the present invention includes a first embodiment in which a prepreg is interposed between a plurality of wiring boards or wiring board materials, a second embodiment in which a prepreg is laminated below a wiring board or a wiring board material, a third embodiment in which a prepreg is laminated above a wiring board or a wiring board material, and a fourth embodiment in which no prepreg is used.

Figure 1:
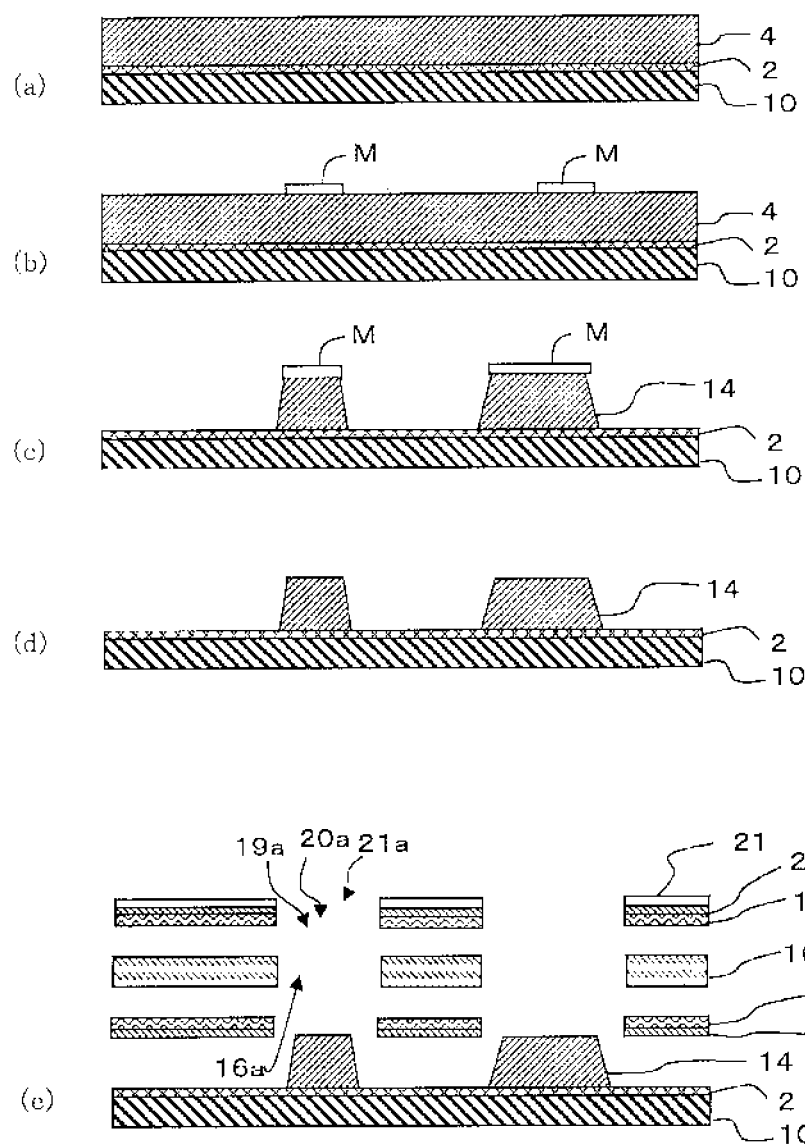
FIG. 1 is a cross-sectional view showing an example of a first embodiment in a method for manufacturing a wiring board or a wiring board material of the present invention.
Figure 2:
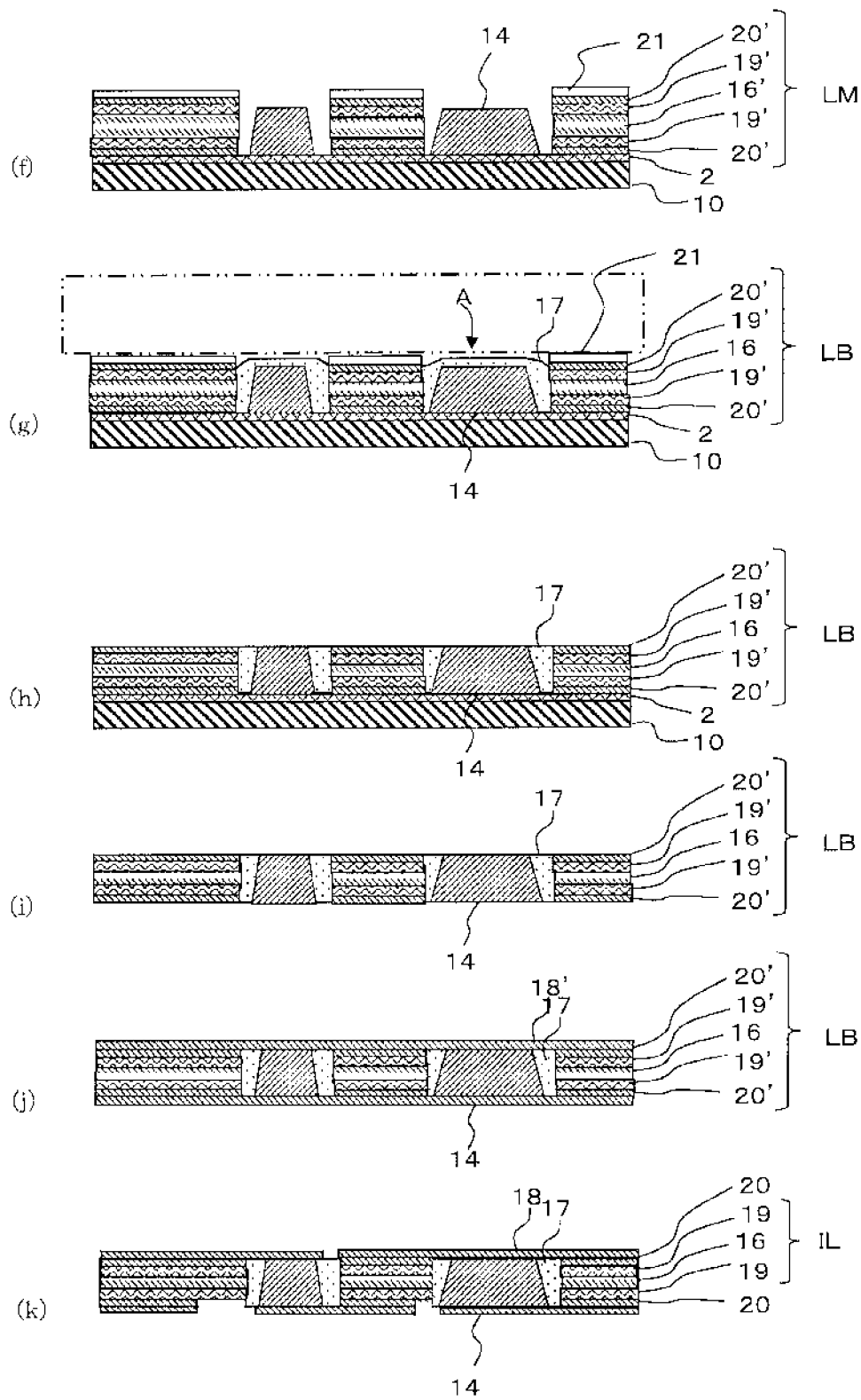
FIG. 2 is a cross-sectional view showing an example of a first embodiment in a method for manufacturing a wiring board or a wiring board material of the present invention.

In each of the first embodiment to the third embodiment, for example, as shown in FIGS. 1 and 2 and the like, the method includes: the steps of: forming a plurality of columnar metal members 14 on a support sheet 10; laminating a laminate material LM including the support sheet 10 having the columnar metal members 14 formed thereon, a wiring board WB or a wiring board material WB' having a plurality of openings in portions corresponding to the columnar metal members 14, and a prepreg 16' having a plurality of openings in the portions corresponding to the columnar metal members 14 and containing a thermosetting resin such that the columnar metal members 14 are positioned in the respective openings; integrating the laminate material LM by heating and pressing to obtain a laminate LB including a thermosetting resin 17 filled between an inner surface of each of the openings of the wiring board WB or the wiring board material WB' and each of the columnar metal members 14; and peeling at least the support sheet 10 from the laminate LB.

Figure 10:
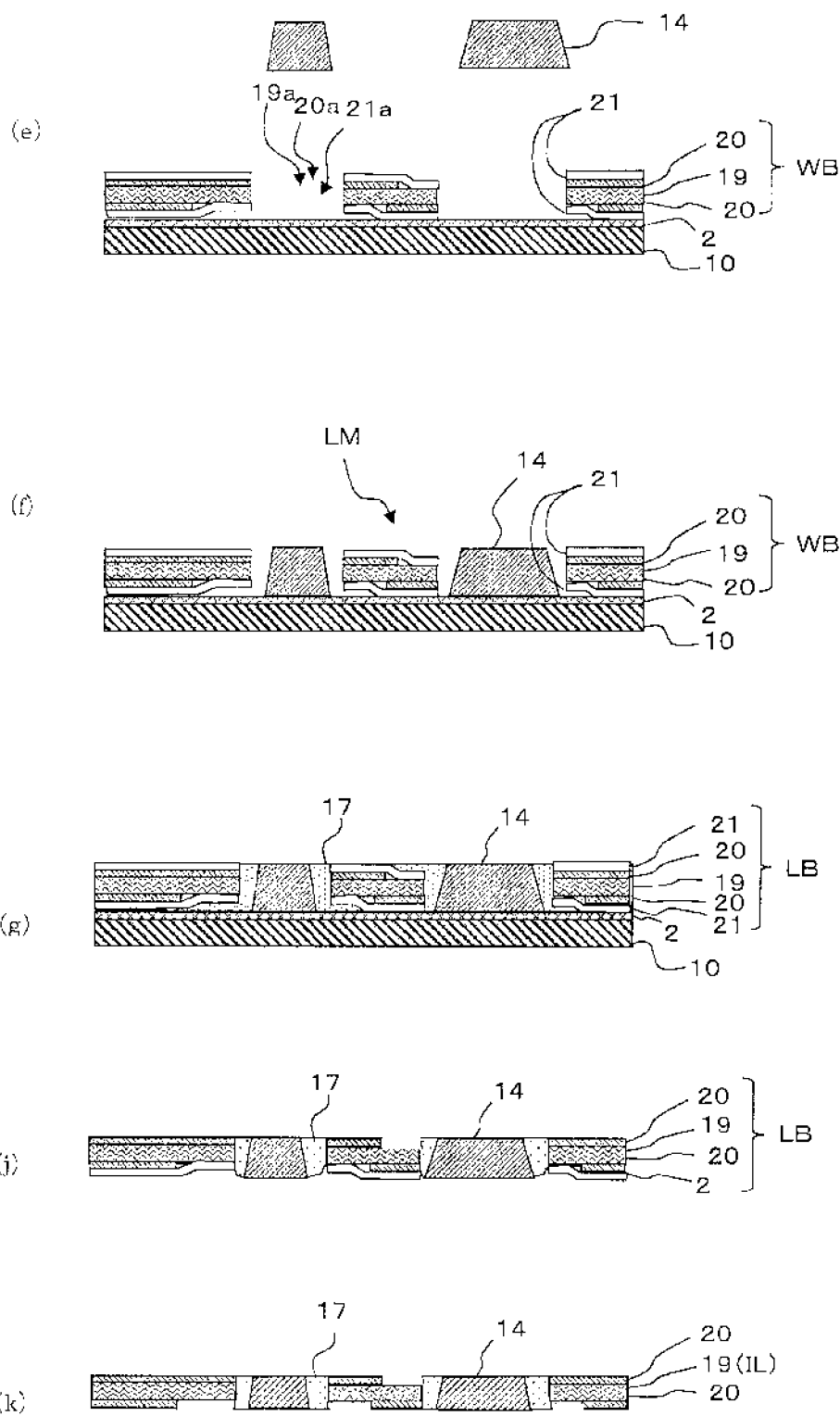
FIG. 10 is a cross-sectional view showing an example of steps of a fourth embodiment for manufacturing a wiring board of the present invention.

On the other hand, in the fourth embodiment, for example, as shown in FIG. 10, a method may include the step of preparing a laminate material LM including a support sheet 10 having a plurality of columnar metal members 14 formed thereon, and a wiring board WB or a wiring board material WB' having a plurality of openings in portions corresponding to the columnar metal members 14 such that the columnar metal members 14 are positioned in the respective openings. A prepreg 16' may not be indispensably laminated. Each of the embodiments will be described below.

First Embodiment

The present invention includes the step of forming a plurality of columnar metal members 14 on a support sheet 10, for example, as shown in FIGS. 1(a) to 1(d). In the present embodiment, an example is shown, in which the step of forming the columnar metal members 14 etches a metal plate 4 adhering to the support sheet 10 with an adhesive layer 2 interposed therebetween, to form the plurality of columnar metal members 14.

As shown in FIGS. 7(a) and 7(b), the columnar metal member 14 formed by etching includes a peripheral wall 14a curved in a longitudinal sectional shape. FIG. 7(a) shows the case where an etching time is comparatively short, and FIG. 7(b) shows the case where an etching time is comparatively long.

Figure 8:
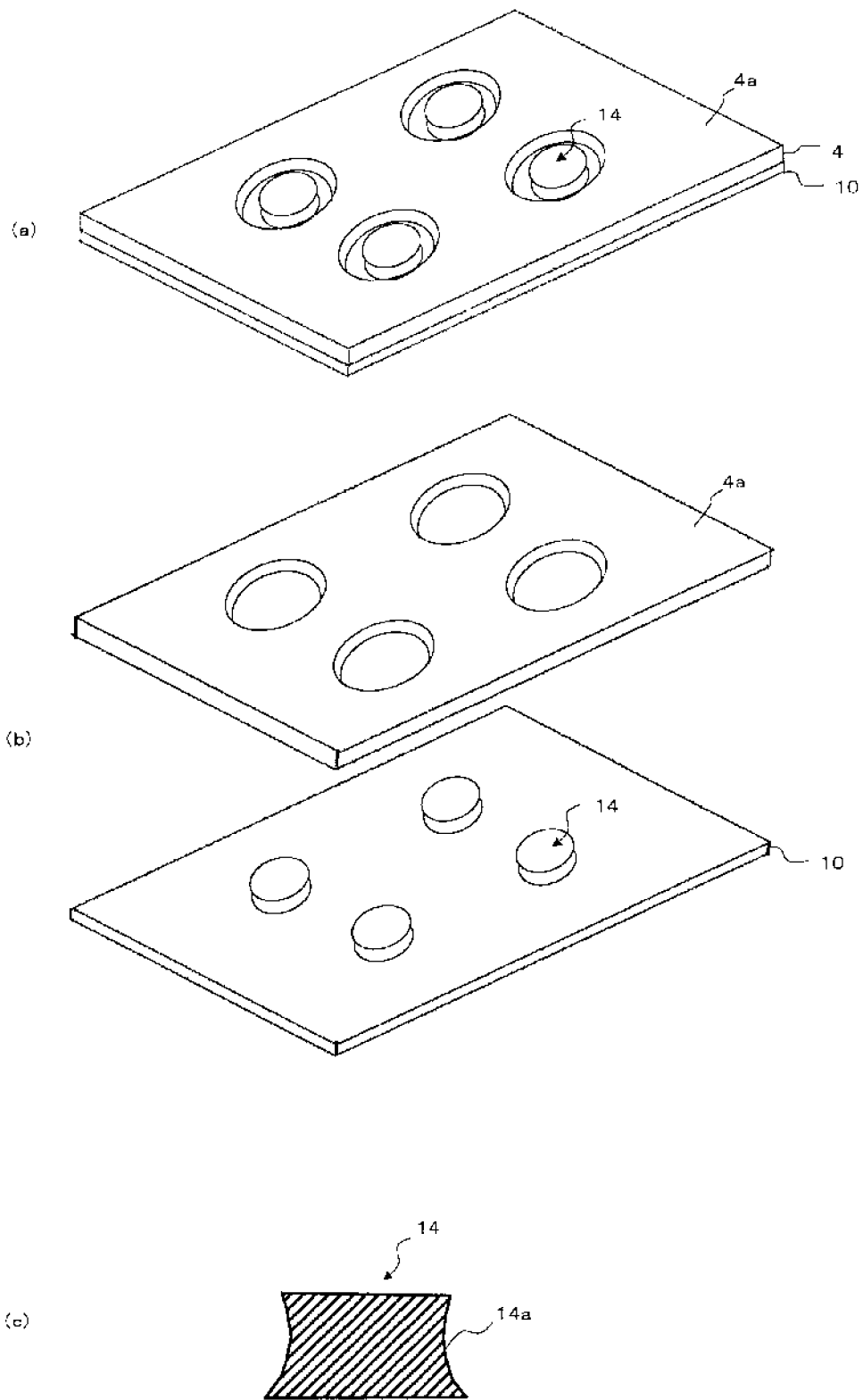

Etching can also be performed by using an etching resist M only at the formation position of each of the columnar metal members 14 (see FIG. 1(c)). However, as shown in FIG. 8, it is preferable to perform etching using the etching resist M such that only the periphery of the formation position of each of the columnar metal members 14 is exposed.

That is, as shown in FIGS. 8(a) and 8(b), only the periphery of the formation position of each of the columnar metal members 14 in the metal plate 4 is etched, and a remaining portion 4a of the metal plate 4 other than the columnar metal members 14 is then peeled, whereby the plurality of columnar metal members 14 can be formed on the support sheet 10.

Thus, the method for performing etching using the etching resist M such that only the periphery of the formation position of each of the columnar metal members 14 is exposed can reduce the use amount of an etching solution, prevent degradation, and easily recycle the peeled metal plate 4. Moreover, as shown in FIG. 8(c), a portion (undercut) having the smallest diameter or outer peripheral length can be formed at the middle portion of the height of each of the columnar metal members 14 (the center of the height or the position above and below the center). This makes it possible to further improve an effect of preventing each of the columnar metal members 14 from coming off.

The present invention preferably includes the step of chemically and/or physically surface-treating the columnar metal members 14 using the support sheet 10 having the columnar metal members 14 formed thereon. Examples of such a surface treatment include a chemical treatment called a blackening treatment and a physical treatment such as sandblasting.

The metal constituting the metal plate 4 may be any metal. For example, copper, a copper alloy, aluminum, stainless steel, nickel, iron, and other alloys and the like may be used. Among them, copper or a copper alloy is preferable from the viewpoints of thermal conductivity, and bonding properties of a solder.

As the support sheet 10, a resin sheet, a rubber sheet, and a metal sheet, and the like can be used, but a resin sheet made of polyester, polyamide, or polyimide and the like is preferable. In particular, polyester such as polyethylene terephthalate or polyethylene naphthalate which has heat resistance and low cost is preferable.

Any adhesive may be used as the adhesive layer 2 as long as it can adhere a metal and a resin and the like. Adhesives such as reaction curing type, thermosetting type, pressure sensitive adhesive type (pressure sensitive adhesive), and hot melt type adhesives can be used. As the pressure sensitive adhesive, a rubber-based pressure sensitive adhesive, an acrylic pressure sensitive adhesive, and a silicone-based pressure sensitive adhesive and the like can be used. The metal plate 4 and the support sheet 10 may be caused to thermally adhere to each other directly without the adhesive layer 2 interposed therebetween; the metal sheet 4 may be formed on the support sheet 10 by plating; or a resin may be coated and formed on the metal plate 4.

Regarding the thickness of each of the layers, for example, the thickness of the support sheet 10 is 30 to 1000 µm; the thickness of the adhesive layer 2 is 1 to 30 µm; and the thickness of the metal plate 4 is 100 to 2000 µm.

Performed is the step of etching the metal plate 4 using such a laminate to form the plurality of columnar metal members 14 on the support sheet 10. By etching, the columnar metal members 14 can be formed at positions where semiconductor elements and the like are mounted.

The metal plate 4 can be selectively etched by using the etching resist M as shown in FIGS. 1(b) and 1(c), for example. The size of each of the columnar metal members 14 can be made smaller than the size of the semiconductor element to be mounted. For example, each of the columnar metal members 14 has a top surface having a diameter of 0.3 to 10 mm. The shape of the top surface of each of the columnar metal members 14 may be any shape such as a quadrilateral shape or a circular shape.

As the etching resist M, a photosensitive resin and a dry film resist (photoresist) and the like can be used. Examples of an etching method include etching methods using various etching solutions according to the types of metals constituting the metal plate 4. For example, when the metal plate 4 is made of copper, a commercially available alkaline etching solution, ammonium persulfate, and hydrogen peroxide/sulfuric acid and the like can be used.

As shown in FIG. 1(d), after etching, the etching resist M is removed. The etching resist M can be removed by chemical or mechanical peeling.

Next, as shown in FIGS. 1(e) to 2(f), performed is the step of laminating a laminate material LM including the support sheet 10 having the columnar metal members 14 formed thereon, a wiring board WB or a wiring board material WB' having a plurality of openings 19a and 20a in portions corresponding to the columnar metal members 14, and a prepreg 16' having a plurality of openings 16a in portions corresponding to the columnar metal members 14 and containing a thermosetting resin 17 such that the columnar metal members 14 are positioned in the respective openings 19a, 20a, and 16a. In the first embodiment, an example is shown, in which the laminate material LM includes a plurality of wiring boards WB or wiring board materials WB' and a prepreg 16' interposed therebetween.

In particular, in the illustrated example, the laminate material LM includes the prepreg 16', and a single-sided metal-clad laminate plate which includes a metal layer 20' disposed on each of both sides of the prepreg', such that the metal layer 20' is positioned on the outside and has a plurality of openings 19a and 20a in portions corresponding to the columnar metal members 14, and the metal layer 20' of the upper single-sided metal-clad laminate plate is covered with a mask material 21. In this example, the mask material 21 has a plurality of openings 21a in portions corresponding to the columnar metal members 14.

The openings 16a of the prepreg 16' can be formed by a drill or a punch. The size of each of the openings 16a is preferably made slightly larger than the top surface of each of the columnar metal members 14. The shape of the top surface of each of the columnar metal members 14 and the shape of each of the openings 16a do not necessarily coincide with each other. Both the top surface of each of the columnar metal members 14 and each of the openings 16a may have the same shape or different shapes (the same applies to other openings).

Any material may be used as the prepreg 16' as long as it contains a thermosetting resin, is deformed during heating and pressing to be solidified by heating and the like, and has heat resistance required for the wiring board. Specific examples thereof include composites of various thermosetting resins such as an epoxy resin, a phenol resin, and a polyimide resin, and reinforcing fibers such as a glass fiber, a ceramic fiber, an aramid fiber, and paper.

It is preferable that the prepreg 16' is made of a material having high thermal conductivity, and examples thereof include a resin containing a thermally conductive filler.

It is preferable that a resin constituting the prepreg 16' has an excellent adhesive force to the columnar metal members 14, and does not impair withstand voltage characteristics and the like. As such a resin, in addition to the epoxy resin, the phenol resin, and the polyimide resin, various engineering plastics can be used singly or in combination of two or more. Among them, the epoxy resin provides an excellent joining force between metals, which is preferable. In particular, among the epoxy resin, a bisphenol A type epoxy resin, a bisphenol F type epoxy resin, a hydrogenated bisphenol A type epoxy resin, a hydrogenated bisphenol F type epoxy resin, a triblock polymer having a bisphenol A type epoxy resin structure at both terminals, and a triblock polymer having a bisphenol F type epoxy resin structure at both terminals which have high flowability and excellent mixing properties with metal oxides and metal nitrides are more preferable resins.

As shown in FIG. 1(e), the wiring board WB or the wiring board material WB' has a plurality of openings 19a and 20a in portions corresponding to the columnar metal members 14. The openings 19a and 20a can be formed by a drill or a punch. The size of each of the openings 19a and 20a is preferably made slightly larger than the top surface of each of the columnar metal members 14.

The single-sided metal-clad laminate plate such as a copper-clad laminate usually has a cured insulating layer 19' adhering to the metal layer 20'. However, in the present invention, the prepreg 16' allows the wiring boards WB or the wiring board materials WB' to adhere to each other, which makes it also possible to use a previously cured insulating layer. The patterned metal layer 20' may be formed on the surface of the cured insulating layer 19'.

As the material of the cured insulating layer 19', a material obtained by curing the same prepreg 16' as described above can be used. A product obtained by integrating the metal layer 20' with the insulating layer 19' may be laminated, or the metal layer 20' and the insulating layer 19' may be separately laminated.

As the metal layer 20', any metal may be used, such as copper, a copper alloy, aluminum, stainless steel, nickel, iron, and other alloys. Among them, copper and aluminum are preferable from the viewpoints of thermal conductivity and electric conductivity.

In the present embodiment, as shown in FIG. 1(e), an example is shown, in which a third opening 21a is formed in the same portion as that of the openings 19a and 20a; a mask material 21 pasted on the wiring board WB or the wiring board material WB' is prepared; and a laminate LB is formed by using the mask material 21.

The mask material 21 may be pasted on the wiring board WB or the wiring board material WB', or may be merely disposed on the wiring board WB or the forming material WB'. As the mask material 21, a material having no third opening 21a can also be used.

In the present invention, it is preferable that the openings 19a and 20a and the third opening 21a are simultaneously formed in a state where the mask material 21 is pasted on the wiring board WB or the wiring board material WB', but these can also be separately formed.

As the mask material 21, a resin film is preferable, and any of polyesters such as polyethylene terephthalate, polyolefins such as polyethylene and polypropylene, and polyamides and the like can also be used. However, polyesters such as polyethylene terephthalate are preferable from the viewpoint of heat resistance.

When the mask material 21 is pasted, a pressure-sensitive adhesive layer is preferably provided on the mask material 21. As the pressure sensitive adhesive, a rubber-based pressure sensitive adhesive, an acrylic pressure sensitive adhesive, and a silicone-based pressure sensitive adhesive and the like can be used. In place of providing the pressure-sensitive adhesive layer on the mask material 21, a pressure-sensitive adhesive layer can be separately coated and formed.

Subsequently, as shown in FIG. 2(g), performed is the step of integrating the laminate material LM by heating and pressing to obtain the laminate LB including the thermosetting resin 17 filled between the inner surface of each of the openings 19a and 20a of the wiring board WB or the wiring board material WB' and each of the columnar metal members 14. This makes it possible to form the laminate in which the height of each of the columnar metal members 14 is the same as or greater than that of the surface of the wiring board WB or the wiring board material WB'.

As a result, as shown in FIG. 2(g), the prepreg 16' becomes a cured product 16, and the top surface of each of the columnar metal members 14 is covered with the thermosetting resin 17 of the prepreg 16' to form a convex portion A. A part of the thermosetting resin 17 of the prepreg 16' may cover the periphery of the third opening 21a. However, the presence of the mask material 21 makes it possible to effectively prevent the thermosetting resin 17 of the prepreg 16' from adhering to the surface of the wiring board WB or the wiring board material WB'. That is, even if the periphery of the third opening 21a of the mask material 21 is covered with the thermosetting resin 17 of the prepreg 16', the thermosetting resin 17 of the prepreg 16' can be removed by merely removing the mask material 21.

A hot press method using a press surface can be employed for heating and pressing. It is preferable that at least a sheet material allowing concave deformation is disposed between the press surface and the laminated product such that the convex portions A are easily formed at positions corresponding to the columnar metal members 14. When the sheet material is not disposed, the height of the convex portion A is the same as that of the top surface of the mask material 21. A press surface may be used, which has concave portions at positions corresponding to the columnar metal members 14.

The hot press method may be performed by using a hot press device (heat laminator, hot press) and the like. At that time, the hot press method may be performed in a vacuum atmosphere (vacuum laminator and the like) in order to avoid the mixing of air. Conditions such as a heating temperature and a pressure may be appropriately set according to the materials and thicknesses of the prepreg and a metal layer forming material, but the pressure is preferably 0.5 to 30 MPa.

The sheet material may be any material as long as it allows concave deformation during hot press, and examples thereof include cushion paper, a rubber sheet, an elastomer sheet, a nonwoven fabric, a woven fabric, a porous sheet, a foam sheet, a metal foil, and a composite thereof. In particular, those which can be elastically deformed such as cushion paper, a rubber sheet, an elastomer sheet, a foam sheet, and a composite thereof are preferable.

Subsequently, as shown in FIG. 2(h), the thermosetting resin 17 covering at least the columnar metal member 14 is removed. That is, the convex portion A above the columnar metal member 14 is removed, to expose the top surface of the columnar metal member 14. It is preferable that the convex portion A is removed and flattened such that the top surface of the metal layer 20' and the height of the columnar metal member 14 coincide with each other. However, in order to easily remove the thermosetting resin 17, the height of the columnar metal member 14 is ideally greater than that of the top surface of the metal layer 20'.

In the present embodiment, the mask material 21 is removed prior to the removal of the convex portion A. However, the mask material 21 can also be removed at the same time when the thermosetting resin 17 is removed.

A method for removing the convex portion A is preferably a method due to grinding or polishing, and examples thereof include a method for using a grinding device having a plurality of hard rotary blades made of diamond and the like and arranged in the radial direction of a rotating plate, and a method for using a sander, a belt sander, a grinder, a plane grinding machine, or a hard abrasive grain molded article and the like. When the grinding device is used, the top surface can be flattened by moving the hard rotary blades along the top surface of the fixedly supported wiring board while the hard rotary blades are rotated. Examples of the polishing method include a light polishing method using a belt sander and buff polishing and the like.

Subsequently, as shown in FIG. 2(i), performed is the step of peeling at least the support sheet 10 from the laminate LB. This makes it possible to obtain a wiring board material before pattern formation. In the present embodiment, the support sheet 10 to which the adhesive layer 2 adheres is peeled together with the adhesive layer 2. At this time, the adhesive force between each of the columnar metal members 14 and the adhesive layer 2 is set so as to be smaller than the adhesive force between each of the columnar metal members 14 and the thermosetting resin 17. Such an adhesive force makes it possible to easily peel the adhesive layer 2 from the metal layer 20' of the single-sided metal-clad laminate plate such as a copper-clad laminate.

When the wiring board material WB' is laminated and integrated as in the present embodiment, the metal layer 20' is pattern-formed as necessary. Prior to this, as shown in FIG. 2(j), the exposed columnar metal member 14 and metal layer 20' can be metal-plated to form a metal plating layer 18'. This makes it possible to obtain a wiring board having a pattern portion extending on at least one surface of each of the columnar metal members 14. Metal species of the metal plating are preferably, for example, copper, silver, and Ni and the like. Examples of a method for forming the metal plating layer 18' include a combination of an electroless plating method and electrolytic plating.

The metal plating layer 18' and the metal layer 20' as shown in FIG. 2(k) can be pattern-formed as follows. For example, a patterned wiring layer 18 can be formed by etching the metal plating layer 18' and the metal layer 20' in a predetermined pattern using an etching resist.

The removal of the etching resist may be appropriately selected according to the type of the etching resist such as removal of a medical agent and peeling removal. For example, a photosensitive ink formed by screen printing is removed with a chemical such as alkali.

As described above, as shown in FIG. 2(k), the wiring board can be obtained, which includes an insulating layer IL, the columnar metal members 14 embedded in the insulating layer IL, and the wiring layer 18, wherein: the insulating layer IL includes the cured product 16 of the prepreg 16'; and the thermosetting resin 17 oozing out from the prepreg causes the periphery of each of the columnar metal members 14 to adhere to the insulating layer IL.

The wiring board of the present invention is useful as a board for mounting a semiconductor element, and is particularly useful as a board for mounting a power semiconductor element and a light-emitting element. Here, the semiconductor element includes a semiconductor bare chip, a chip part, and a semiconductor package, and the power semiconductor element includes semiconductor elements such as various transistors used in an inverter device and a voltage conversion device and the like, and various diodes.

In general, a package for these power semiconductor devices includes a metal heat dissipation plate in addition to a lead. For example, in the case of the diode, the heat dissipation plate has an equal potential to that of a cathode, and an electrode having an equal potential to that of the heat dissipation plate is determined according to a package form.

Examples of a semiconductor element 30 include a bipolar-based power transistor, a MOSFET, an IGBT, and a FWD (freewheeling diode). In addition to a conventional semiconductor element using Si, a semiconductor element using SiC (silicon carbide) or GaN (gallium nitride) can be used.

Second Embodiment

A second embodiment of the present invention will be described with respect to points different from those of the first embodiment. The second embodiment also includes the step of forming a plurality of columnar metal members 14 on a support sheet 10, and the second embodiment can be performed in the same manner as in the first embodiment as shown in FIGS. 1(a) to 1(d), for example.

Figure 3:
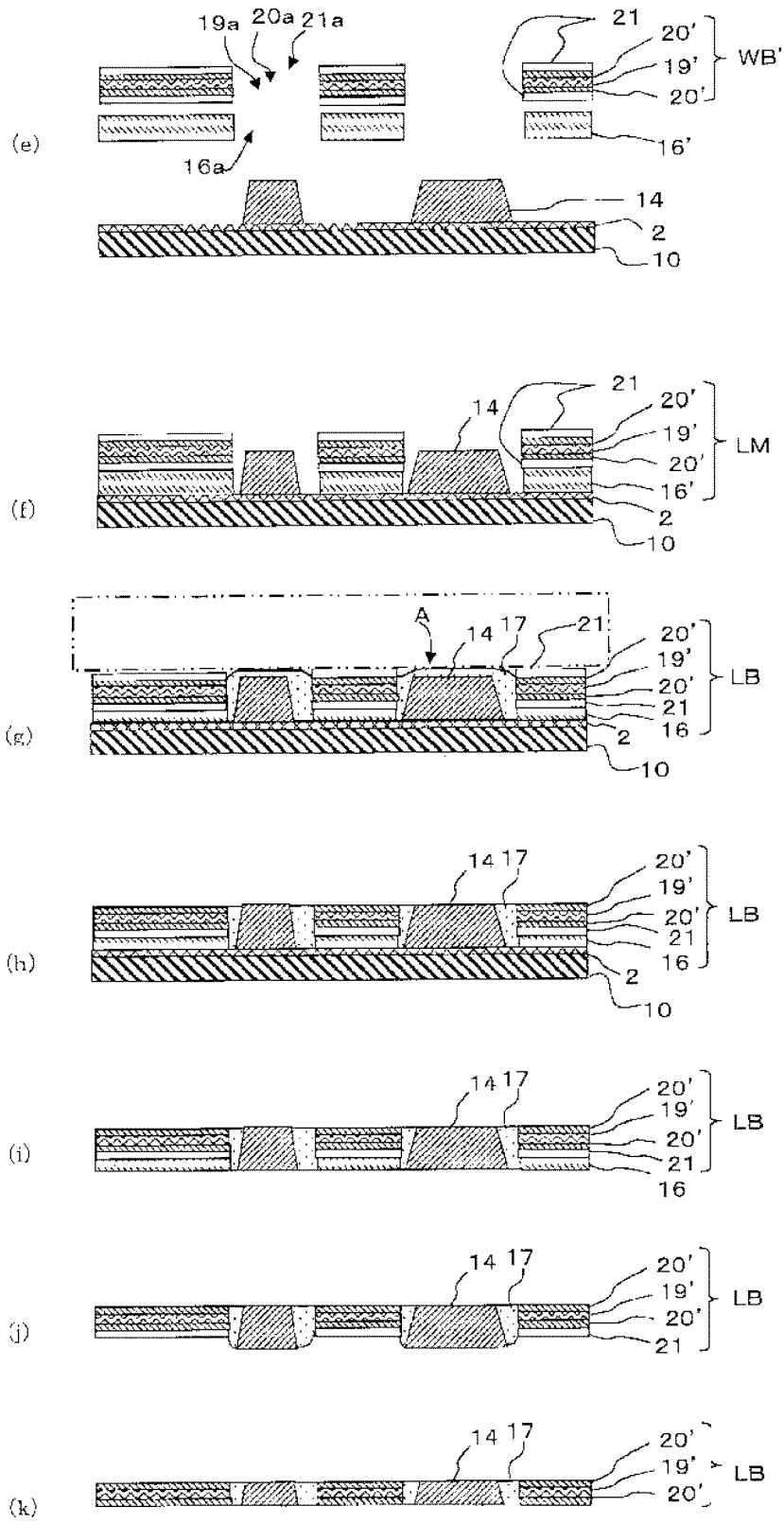
FIG. 3 is a cross-sectional view showing an example of a second embodiment in a method for manufacturing a wiring board or a wiring board material of the present invention.

In the second embodiment, as shown in FIGS. 3(e) and 3(f), a laminate material LM includes a prepreg 16' interposed between a wiring board WB or a wiring board material WB' and the support sheet 10. In the present embodiment, an example is shown, in which the lower side of the wiring board WB or the wiring board material WB' is covered with a mask material 21 such as a resin film. This makes it possible to easily peel the prepreg 16' from the wiring board WB or the wiring board material WB'. As the mask material 21, the same material as that in the first embodiment can be used.

Subsequently, as shown in FIG. 3(g), performed is the step of integrating the laminate material LM by heating and pressing to obtain a laminate LB including a thermosetting resin 17 filled between the inner surface of each of openings 19a and 20a of the wiring board WB or the wiring board material WB' and each of columnar metal members 14. This makes it possible to form the laminate LB in which the height of each of the columnar metal members 14 is the same as or greater than that of the surface of the wiring board WB or the wiring board material WB'.

Thereafter, as shown in FIG. 3(h), the thermosetting resin (convex portion A) covering the top surface of each of the columnar metal members 14 is removed in the same manner as in the first embodiment. When the top surface of each of the columnar metal members 14 is higher than the surface of the wiring board WB or the wiring board material WB', the columnar metal members 14 can also be removed by that rate as necessary.

In the second embodiment, as shown in FIGS. 3(i) and 3(j), performed is the step of peeling the support sheet 10 from the laminate LB, and thereafter peeling a cured product 16 of the prepreg 16'. As a result, the cured product 16 of the prepreg 16' breaks at the boundary with the thermosetting resin 17 covering the periphery of each of the columnar metal members 14, whereby the cured product 16 of the prepreg 16' can be peeled from the laminate LB. At this time, the support sheet 10 and the prepreg 16' can also be peeled at the same time. In the present embodiment, furthermore, an example is shown, in which the lower mask material 21 is peeled.

As a result, as shown in FIG. 3(j), the laminate LB is obtained, in which the columnar metal members 14 protruding downward and the thermosetting resin 17 covering the periphery of each of the columnar metal members 14 are present. The laminate LB can be used as it is, but the lower surface of the laminate LB is preferably flat.

Therefore, as shown in FIG. 3(k), the columnar metal members 14 and the thermosetting resin 17 are cut, whereby the laminate LB having a flat lower surface can be obtained. Such a cutting step can be performed in the same manner as in the cutting and the like of the top surface of each of the columnar metal members 14 in the first embodiment. This makes it possible to obtain a wiring board material before pattern formation.

Furthermore, in the same manner as in the first embodiment, a wiring board having a wiring layer can be obtained by forming or pattern-forming a metal plating layer.

Third Embodiment

A third embodiment of the present invention will be described with respect to points different from those of the first embodiment. The third embodiment also includes the step of forming a plurality of columnar metal members 14 on a support sheet 10, and the third embodiment can be performed in the same manner as in the first embodiment as shown in FIGS. 1(a) to 1(d), for example.

Figure 4:
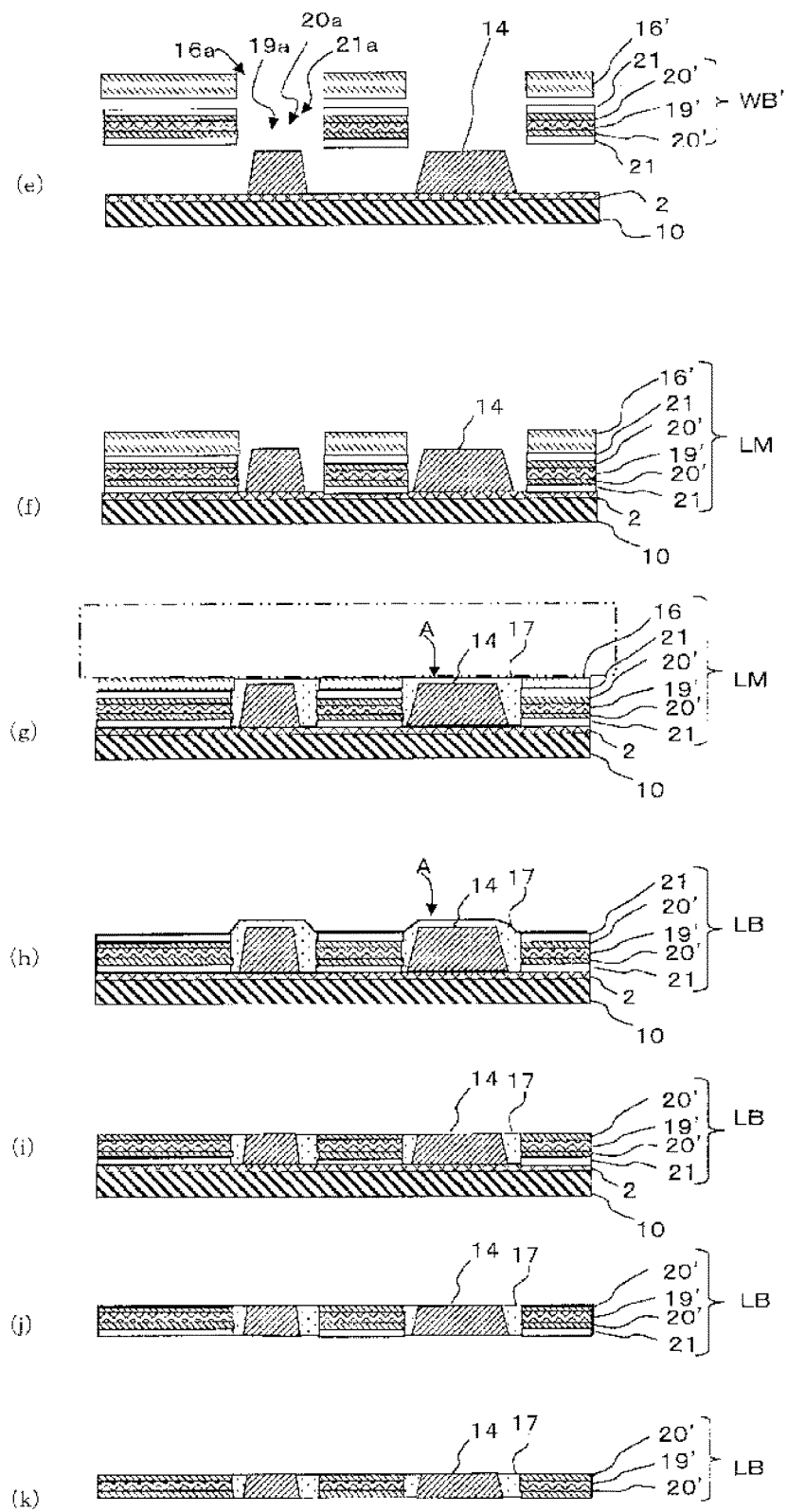
FIG. 4 is a cross-sectional view showing an example of a third embodiment in a method for manufacturing a wiring board or a wiring board material of the present invention.

In the third embodiment, as shown in FIGS. 4(e) and 4(f), a laminate material LM includes a prepreg 16' on a wiring board WB or a wiring board material WB'. In the present embodiment, an example is shown, in which the upper and lower sides of the wiring board WB or the wiring board material WB' are covered with a mask material 21 such as a resin film. This makes it possible to easily peel a cured product 16 of the prepreg 16' from the wiring board WB or the wiring board material WB'. As the mask material 21, the same material as that in the first embodiment can be used.

Subsequently, as shown in FIG. 4(g), performed is the step of integrating the laminate material LM by heating and pressing to obtain a laminate LB including a thermosetting resin 17 filled between the inner surface of each of openings 19a and 20a of the wiring board WB or the wiring board material WB' and each of the columnar metal members 14. This makes it possible to form the laminate LB in which the height of each of the columnar metal members 14 is greater than that of the surface of the wiring board WB or the wiring board material WB'.

Thereafter, as shown in FIG. 4(h), performed is the step of peeling the cured product 16 of the prepreg 16' from the laminate LB. As a result, the cured product 16 of the prepreg 16' breaks at the boundary with the thermosetting resin 17 covering the periphery of each of the columnar metal members 14, whereby the cured product 16 of the prepreg 16' can be peeled from the laminate LB.

Subsequently, as shown in FIG. 4(i), the mask material 21 is peeled in the same manner as in the first embodiment, and the thermosetting resin (convex portion A) covering the top surface of each of the columnar metal members 14 is then removed. The top surface of each of the columnar metal members 14 is higher than the surface of the wiring board WB or the wiring board material WB', whereby the columnar metal members 14 is preferably removed by cutting and the like by that rate.

In the third embodiment, as shown in FIG. 4(j), the support sheet 10 is peeled from the laminate LB. The support sheet 10 and the mask material 21 can be separated at the same time, but in the present embodiment, an example is shown, in which the lower mask material 21 is separately peeled.

As a result, the laminate LB is obtained, in which the columnar metal members 14 protruding downward by the thickness of the mask material 21 and the thermosetting resin 17 covering the periphery of each of the columnar metal members 14 are present. The laminate LB can be used as it is, but the lower surface of the laminate LB is preferably flat.

Therefore, as shown in FIG. 4(k), the lower surface of each of the columnar metal members 14 is cut, whereby the laminate LB having a flat lower surface can be obtained. Such a cutting step can be performed in the same manner as in the cutting and the like of the top surface of each of the columnar metal members 14 in the first embodiment. This makes it possible to obtain a wiring board material before pattern formation.

Furthermore, in the same manner as in the first embodiment, a wiring board having a wiring layer can be obtained by forming or pattern-forming a metal plating layer.

Fourth Embodiment

A fourth embodiment of the present invention will be described with respect to points different from those of the first embodiment. As shown in FIG. 10(f), for example, the fourth embodiment includes the step of preparing a laminate material LM including a support sheet 10 having a plurality of columnar metal members 14 formed thereon, and a wiring board WB or a wiring board material WB' having a plurality of openings in portions corresponding to the columnar metal members 14, wherein the columnar metal members 14 are positioned in the respective openings.

The step may include the step of forming the plurality of columnar metal members 14 on the support sheet 10, and in that case, as shown in FIGS. 1(a) to 1(d), for example, the step can be performed in the same manner as in the first embodiment.

As shown in FIGS. 10(e) and 10(f), the support sheet 10 having an adhesive layer 2 and the wiring board WB having a plurality of openings 19a and 20a may be laminated such that the openings 19a and 20a overlap with each other, and the columnar metal members 14 may be disposed such that these are positioned in the openings. In place of the support sheet 10 having the adhesive layer 2, a support sheet 10 having no adhesive layer 2 can be also used. As shown in the drawings, the upper and lower sides of the wiring board WB may be covered with a mask material 21 such as a resin film.

In the fourth embodiment, as shown in FIGS. 10(*e*) and 10(*f*), the laminate material LM does not include a prepreg 16'. In the present embodiment, an example is shown, in which the upper and lower sides of the wiring board WB are covered with a mask material 21 such as a resin film. This makes it possible to easily peel a cured product of a thermosetting resin 17 from the wiring board WB. As the mask material 21, the same material as that in the first embodiment can be used.

Subsequently, as shown in FIG. 10(*g*), performed is the step of filling and curing the thermosetting resin 17 between the inner surface of each of the openings of the wiring board WB or the wiring board material WB' and each of the columnar metal members 14 to obtain a laminate LB. This makes it possible to form the laminate LB in which the height of each of the columnar metal members 14 is greater than that of the surface of the wiring board WB or the wiring board material WB'.

A method for filling the thermosetting resin 17 may be any of various printing methods using an inkjet printer and the like, partial coating using a dispenser, partial filling using a squeegee, spraying, and coating using a curtain coater and the like. Among them, from the viewpoint of efficient filling, an ink jet printer is preferably used. When overall coating is performed, an excess thermosetting resin 17 is preferably removed by a method for peeling the mask material 21, and a method for performing polishing, and the like.

The thermosetting resin 17 is filled under a reduced pressure atmosphere, whereby the thermosetting resin 17 can be more reliably filled in a gap between the inner surface of each of the openings and each of the columnar metal members 14. That is, even when voids or airspaces occur in the thermosetting resin 17 filled under a reduced pressure atmosphere, the voids and the airspaces can be reduced or eliminated by returning the reduced pressure atmosphere to the atmospheric pressure after filling.

The thermosetting resin 17 to be used may be cured at room temperature after filling (reactive curing type), but a thermosetting resin which is cured by heating may be used, and the heating step may be employed for curing. In the heating step, it is also possible to use a heating apparatus including a heater, and the like, as well as a hot press apparatus capable of applying pressure at the same time.

Thereafter, as shown in FIG. 10(*j*), in the same manner as in the first embodiment, the mask material 21 is peeled, and the thermosetting resin covering the top surface of each of the columnar metal members 14 is then removed as necessary. When the top surface of each of the columnar metal members 14 is higher than the surface of the wiring board WB or the wiring board material WB', the columnar metal members 14 are preferably removed by cutting and the like by that rate.

Furthermore, in the fourth embodiment, as shown in FIGS. 10(*j*) and 10(*k*), the support sheet 10 is peeled from the laminate LB. The support sheet 10 and the mask material 21 can be separated at the same time, but in the present embodiment, an example is shown, in which the lower mask material 21 is separately peeled.

As a result, the laminate LB is obtained, in which the columnar metal members 14 protruding downward by the thickness of the mask material 21 and the thermosetting resin 17 covering the periphery of each of the columnar metal members 14 are present. The laminate LB can be used as it is, but the lower surface of the laminate LB is preferably flat.

Therefore, as shown in FIG. 10(*k*), the lower surface of each of the columnar metal members 14 is cut, whereby the laminate LB having a flat lower surface can be obtained. Such a cutting step can be performed in the same manner as in the cutting and the like of the top surface of each of the columnar metal members 14 in the first embodiment. This makes it possible to obtain a wiring board material before pattern formation.

In place of the wiring board WB, a wiring board material WB' which is not pattern-formed can also be used. In that case, in the same manner as in the first embodiment, a metal plating layer is formed or a metal plating layer is pattern-formed, whereby a wiring board having a wiring layer can be obtained.

That is, as shown in FIG. 10(*k*), the fourth embodiment can manufacture a wiring board WB having an opening, the wiring board including: a columnar metal member 14 positioned in the opening; and a thermosetting resin 17 filled and cured between the inner surface of the opening and the columnar metal member 14.

Another Embodiment (1) In the above-described embodiment, an example is shown, in which the metal plate adhering to the support sheet is etched to form the plurality of columnar metal members, but it is also possible to cause a plurality of columnar metal members previously formed by etching or other methods to adhere to a support sheet. In that case, it is also possible to transfer a plurality of columnar metal members to a support sheet from a transfer sheet having the columnar metal members previously positioned thereon, to cause the columnar metal members to adhere to the support sheet, or to cause individual columnar metal members to sequentially adhere to a support sheet using a mounting apparatus and the like. Examples of the columnar metal members formed by methods other than etching include metal pins and metal plates manufactured by punching and molding and the like. Such columnar metal members can have a three-dimensional shape having an unchanged cross-sectional shape in a thickness direction.

(2) In the above-described embodiment, an example is shown, in which the wiring board and the like is manufactured by using the wiring board material WB' before forming the wiring pattern, but as shown in FIG. 5, it is also possible to use a wiring board WB having a wiring pattern 20 and an insulating layer 19. The illustrated example corresponds to the second embodiment in which the prepreg 16' is laminated below the wiring board WB or the wiring board material WB', but also in the first embodiment and the third embodiment, a wiring board and the like can be manufactured by using the material WB'.

First, as shown in FIG. 5(*e*), a laminate material LM including a support sheet 10 having columnar metal members 14 formed thereon, a wiring board WB having a plurality of openings 19*a* and 20*a* in portions corresponding to the columnar metal members 14, and a prepreg 16' having a plurality of openings 16*a* in portions corresponding the columnar metal members 14 and containing a thermosetting resin 17 is laminated such that the columnar metal members 14 are positioned in the respective openings 19*a*, 20*a*, and 16*a*. At this time, it is preferable that both the surfaces of the wiring board WB are covered with a mask material 21, and it is more preferable that the mask material 21 has a plurality of openings 21*a* in portions corresponding to the columnar metal members 14.

Subsequently, as shown in FIG. 5(g), performed is the step of integrating the laminate material LM by heating and pressing to obtain a laminate LB including the thermosetting resin 17 filled between the inner surface of each of the openings 19a and 20a of the wiring board WB and each of the columnar metal members 14. This makes it possible to form the laminate LB in which the height of each of the columnar metal members 14 is the same as or greater than that of the top surface of the wiring board WB.

Thereafter, as shown in FIG. 5(j), in the same manner as in the first embodiment, the mask material 21 as the top surface is peeled, and the thermosetting resin (convex portion A) covering the top surface of each of the columnar metal members 14 is removed. When the top surface of each of the columnar metal members 14 is higher than the top surface of the wiring board WB, the columnar metal members 14 can also be removed by that rate as necessary.

In the second embodiment, as shown in FIG. 5(j), performed is the step of peeling the support sheet 10 from the laminate LB, and thereafter peeling the cured product 16 of the prepreg 16'. As a result, the cured product 16 of the prepreg 16' breaks at the boundary with the thermosetting resin 17 covering the periphery of each of the columnar metal members 14, whereby the cured product 16 of the prepreg 16' can be peeled from the laminate LB. At this time, the support sheet 10 and the prepreg 16' can also be peeled at the same time. In the present embodiment, furthermore, an example is shown, in which the lower mask material 21 is peeled. As a result, the laminate LB is obtained, in which the columnar metal members 14 protruding downward and the thermosetting resin 17 covering the periphery of each of the columnar metal members 14 are present. The laminate LB can be used as it is, but the lower surface of the laminate LB is preferably flat.

Therefore, as shown in FIG. 5(k), by cutting the lower surface of each of the columnar metal members 14 and the thermosetting resin 17, the laminate LB having a flat lower surface can be obtained. Such a cutting step can be performed in the same manner as in the cutting and the like of the top surface of each of the columnar metal members 14 in the first embodiment.

This makes it possible to obtain the wiring board which includes an insulating layer IL, the columnar metal members 14 embedded in the insulating layer IL, and the wiring layer (wiring pattern 20). The insulating layer IL includes the cured product 16 of the prepreg 16', and the thermosetting resin 17 different from the resin component of the insulating layer IL causes the periphery of each of the columnar metal members 14 to adhere to the insulating layer IL.

A double-sided wiring board used as in the illustrated example preferably has an interlayer connection structure such as a plated through hole, a metal bump, a filled via, or a plated via.

Figure 6:
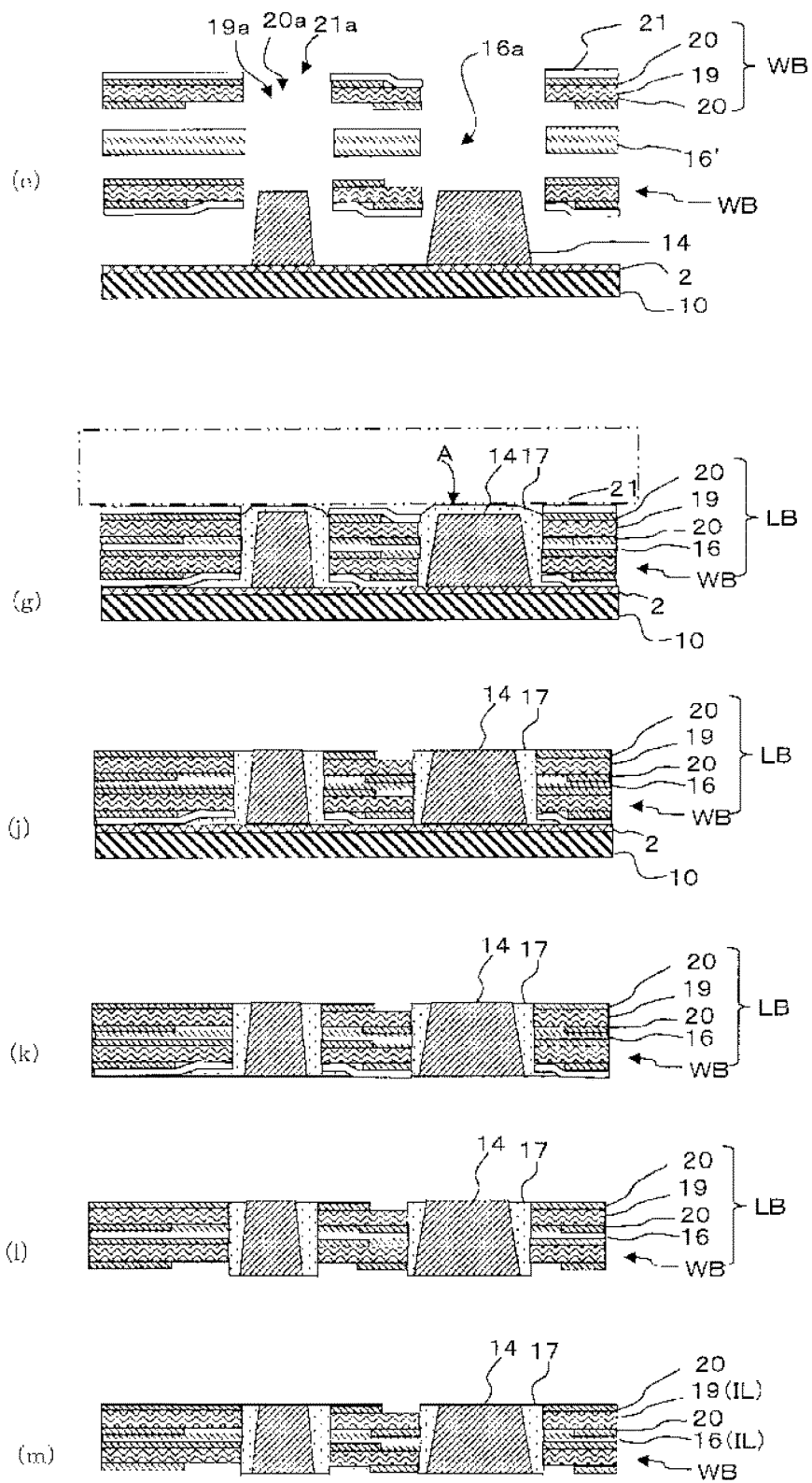
FIG. 6 is a cross-sectional view showing an example of another embodiment in a method for manufacturing a wiring board or a wiring board material of the present invention.

(3) In the above-described embodiment, an example is shown, in which the first embodiment is performed by using the wiring board material WB' before the wiring pattern is formed, but as shown in FIG. 6, the first embodiment can also be performed by using the wiring board WB including the wiring pattern 20 and the insulating layer 19.

First, as shown in FIG. 6(e), a laminate material LM which includes a support sheet 10 having columnar metal members 14 formed thereon, two wiring boards WB having a plurality of openings 19a and 20a in portions corresponding to the columnar metal members 14, and a prepreg 16' interposed therebetween, having a plurality of openings 16a in portions corresponding to the columnar metal members 14, and containing a thermosetting resin 17 is laminated such that the columnar metal members 14 are positioned in the respective openings 19a, 20a, and 16a. At this time, the top surface of the upper wiring board WB and the lower surface of the lower wiring board WB are preferably covered with a mask material 21, and the mask material 21 more preferably has a plurality of opening 21a in portions corresponding to the columnar metal members 14.

Subsequently, as shown in FIG. 6(g), performed is the step of integrating the laminate material LM by heating and pressing to obtain a laminate LB including the thermosetting resin 17 filled between the inner surface of each of the openings 19a and 20a of the wiring board WB and each of the columnar metal members 14. This makes it possible to form the laminate LB in which the height of each of the columnar metal members 14 is the same as or greater than that of the top surface of the wiring board WB.

Thereafter, as shown in FIG. 6(j), in the same manner as in the first embodiment, the mask material 21 as the top surface is peeled, and the thermosetting resin (convex portion A) covering the top surface of each of the columnar metal members 14 is removed. When the top surface of each of the columnar metal members 14 is higher than the top surface of the wiring board WB, the columnar metal members 14 can also be removed by that rate as necessary.

Subsequently, as shown in FIG. 6(k), the support sheet 10 is peeled from the laminate LB.

As shown in FIG. 6(l), the mask material 21 is peeled from the laminate LB. As a result, the laminate LB is obtained, in which the columnar metal members 14 protruding downward and the thermosetting resin 17 covering the periphery of each of the columnar metal members 14 are present. The laminate LB can be used as it is, but the lower surface of the laminate LB is preferably flat.

Therefore, as shown in FIG. 6(m), by cutting the lower surface of each of the columnar metal members 14 and the thermosetting resin 17, the laminate LB having a flat lower surface can be obtained. Such a cutting step can be performed in the same manner as in the cutting and the like of the top surface of each of the columnar metal members 14 in the first embodiment.

As a result, a wiring board can be obtained, which includes the insulating layer IL, the columnar metal member 14 embedded in the insulating layer IL, and the wiring layer (wiring pattern 20). The insulating layer IL contains the cured product 16 of the prepreg 16', and the thermosetting resin 17 oozing out from the prepreg causes the periphery of each of the columnar metal members 14 to adhere to the insulating layer IL.

A double-sided wiring board used as in the illustrated example preferably has an interlayer connection structure such as a plated through hole, a metal bump, a filled via, or a plated via.

(4) In the above-described embodiment, an example is shown, in which the laminate is formed by using the mask material, but in the present invention, a wiring board or its forming material can also be laminated without using the mask material, to form a laminate. In that case, the periphery of each of the openings of the wiring board or its forming material may be covered with the thermosetting resin of the prepreg, but it can be removed in the later process.

(5) In the above-described embodiment, an example is shown, in which the wiring layer of the wiring board WB to be used has a normal thickness, but in the present invention, it is also possible to use a wiring board WB having a thicker wiring layer (for example, a thickness of more than half of that of the insulating layer). It is also possible to employ a structure in which the columnar metal members 14 are connected in a pattern having the same thickness, or a structure in which a wiring pattern having the same thickness as that of each of the columnar metal members 14 is embedded in the insulating layer independently of the columnar metal members 14.

(6) The wiring board of the present invention can also be manufactured by methods other than the manufacturing method of the present invention described above. Examples of such a manufacturing method include a manufacturing method including steps shown in FIG. 9.

First, as shown in FIGS. 9(*e*) and 9(*f*), a support sheet 10 having an adhesive layer 2, a wiring board WB having a plurality of openings 19*a* and 20*a*, and a prepreg 16' having a plurality of openings 16*a* and containing a thermosetting resin 17 are laminated such that the respective openings 19*a*, 20*a*, and 16*a* overlap with each other, and the columnar metal members 14 are disposed such that these are positioned in the openings. In place of the support sheet 10 having the adhesive layer 2, a support sheet 10 having no adhesive layer 2 can be also used.

In other words, the openings 19*a*, 20*a*, and 16*a* are provided in portions corresponding to positions where the columnar metal members 14 are provided. Both the surfaces of the wiring board WB are preferably covered with a mask material 21, and the mask material 21 more preferably has a plurality of openings 21*a* in portions corresponding to the columnar metal members 14.

Subsequently, as shown in FIG. 9(*g*), performed is the step of integrating the laminate material LM by heating and pressing to obtain a laminate LB including the thermosetting resin 17 filled between the inner surface of each of the openings 19*a* and 20*a* of the wiring board WB and each of the columnar metal members 14. This makes it possible to form the laminate LB in which the height of each of the columnar metal members 14 is the same as or greater than that of the top surface of the wiring board WB.

Thereafter, as shown in FIG. 9(*j*), the support sheet 10 having the adhesive layer 2 is peeled from the laminate LB, and the cured product 16 of the prepreg 16' and the mask material 21 as the top surface are then peeled. As a result, the cured product 16 of the prepreg 16' breaks at the boundary with the thermosetting resin 17 present around each of the columnar metal members 14, whereby the thermosetting resin 17 covering the top surface of each of the columnar metal members 14, and the cured product 16 of the prepreg 16' can be peeled from the laminate LB. When the top surface of each of the columnar metal members 14 is higher than the top surface of the wiring board WB, the columnar metal members 14 can also be removed by that rate as necessary.

In this example, as shown in FIG. 9(*j*), the laminate LB is obtained, in which the columnar metal members 14 protruding downward and the thermosetting resin 17 covering the periphery of each of the columnar metal members 14 are present. The laminate LB can also be used as it is, but the lower surface of the laminate LB is preferably flat.

Therefore, as shown in FIG. 9(*k*), the lower surface of each of the columnar metal members 14 and the thermosetting resin 17 are preferably cut, whereby the laminate LB having a flat lower surface can be obtained. Such a cutting step can be performed in the same manner as in the cutting and the like of the top surface of each of the columnar metal members 14 in the first embodiment.

This makes it possible to obtain the wiring board which includes an insulating layer IL, the columnar metal members 14 embedded in the insulating layer IL, and the wiring layer (wiring pattern 20). The insulating layer IL includes the cured product 16 of the prepreg 16', and the thermosetting resin 17 different from the resin component of the insulating layer IL causes the periphery of each of the columnar metal members 14 to adhere to the insulating layer IL.

Figure 11:
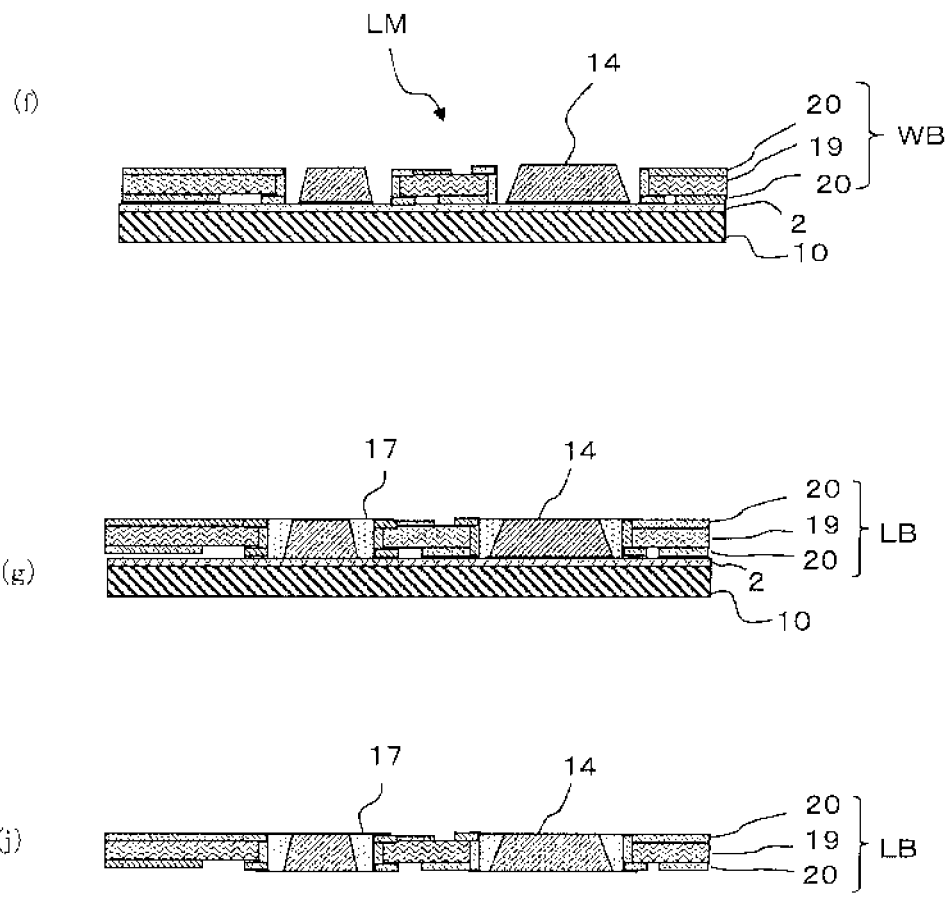
FIG. 11 is a cross-sectional view showing an example of steps of another embodiment for manufacturing a wiring board of the present invention.

(7) In the above-described embodiment, an example is shown, in which the plated through hole 30 is not formed in each of the openings of the wiring board WB or the wiring board material WB', but as shown in FIG. 11, the plated through hole 30 may be formed in each of the openings. The plated through hole 30 can be formed in each of the openings of the wiring board WB or the wiring board material WB' in the second to fourth embodiments.

In that case, for example, as shown in FIG. 11(*f*), performed is the step of preparing a laminate material LM including a support sheet 10 having a plurality of columnar metal members 14 formed thereon, and a wiring board WB or a wiring board material WB' having a plurality of openings in portions corresponding to the columnar metal members 14, and having a through hole 30 formed in each of the openings, wherein the columnar metal members 14 are positioned in the openings.

Subsequently, as shown in FIG. 11(*g*), for example, performed is the step of filling and curing the thermosetting resin 17 between the inner surface of the plated through hole 30 in each of the openings of the wiring board WB or the wiring board material WB' and each of the columnar metal members 14, to obtain a laminate LB.

In the illustrated example, the heights of the top and lower surfaces of each of the columnar metal members 14 coincide with the top and lower surfaces of the wiring board WB or the wiring board material WB'. Therefore, as shown in FIG. 11(*j*), by merely peeling the support sheet 10 from the laminate LB, the wiring board WB having an opening can be manufactured, which includes: a columnar metal member 14 positioned in the opening; and a thermosetting resin 17 filled and cured between the inner surface of the opening and the columnar metal member 14.

The use of the wiring board WB or the wiring board material WB' having the plated through hole 30 formed therein makes it possible to manufacture the wiring board having the plated through hole formed in the opening.

Figure 12:
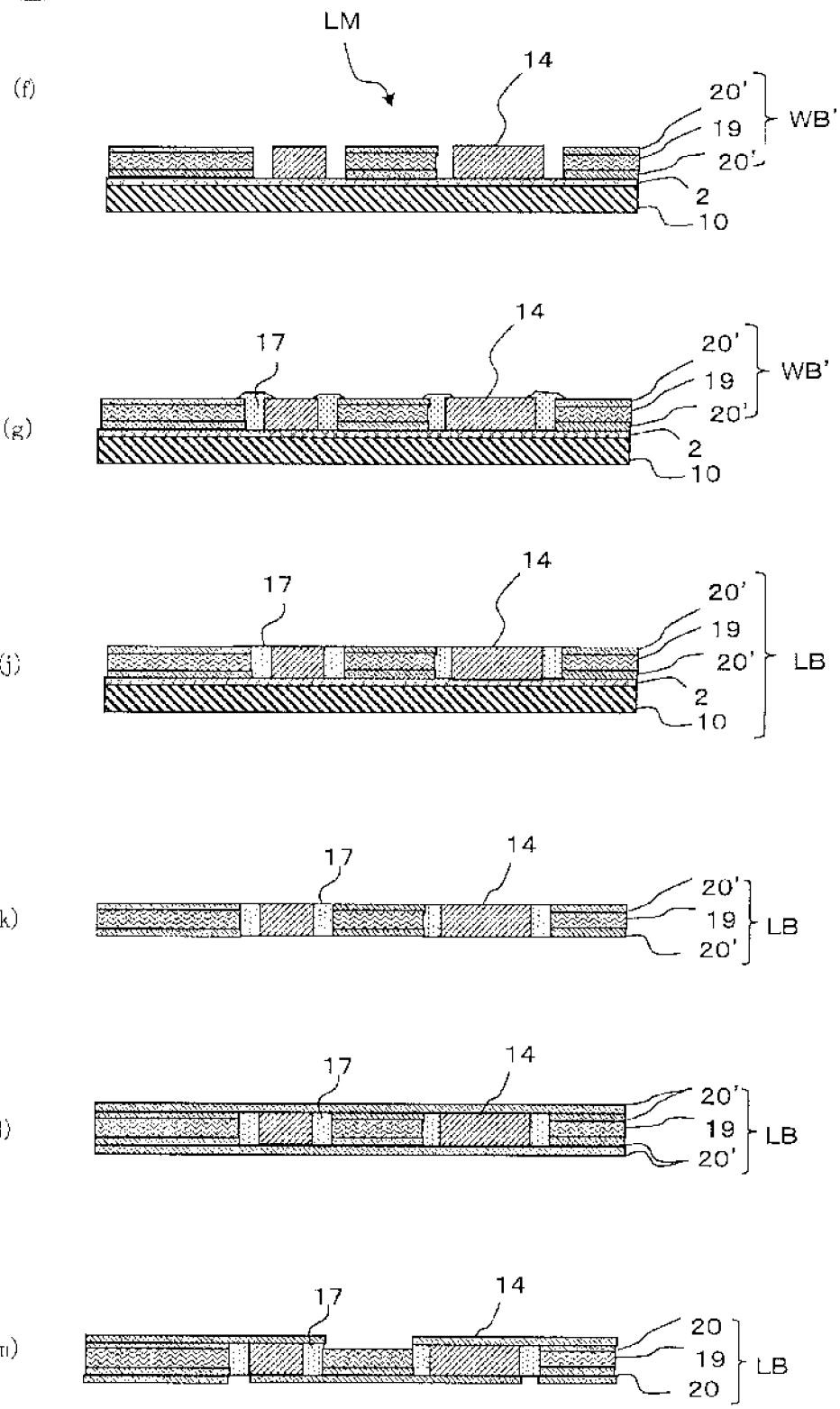
FIG. 12 is a cross-sectional view showing an example of steps of another embodiment for manufacturing a wiring board of the present invention.

(8) In the above-described fourth embodiment, an example is shown, in which the pattern-formed wiring board WB is used, but as shown in FIG. 12, the wiring board material WB' before pattern formation can also be used. In the illustrated example, a plurality of columnar metal members 14 made of pins are used in place of etching.

In the above case, as shown in FIG. 12(*f*), for example, performed is the step of preparing a laminate material LM including a support sheet 10 having a plurality of pins as the columnar metal members 14 formed thereon, and a wiring board material WB' having a plurality of openings in portions corresponding to the columnar metal members 14, wherein the columnar metal members 14 are positioned in the openings. As the wiring board material WB', a wiring board material including a metal layer 20' formed on each of both the surfaces of an insulating layer 19 can be used.

Subsequently, as shown in FIG. 12(*g*), for example, the thermosetting resin 17 is filled between the inner surface of the plated through hole 30 in each of the openings of the wiring board material WB' and each of the columnar metal members 14 by printing and the like. At this time, the vicinity of the top surface of the thermosetting resin 17 after filling is convex, and this is cured by heating and the like.

Subsequently, as shown in FIG. 12(*j*), the convex portion in the vicinity of the top surface of the cured thermosetting resin 17 is removed to obtain a laminate LB having a flat top surface and including the cured thermosetting resin 17. In the illustrated example, the height of the top surface of each of the columnar metal members 14 coincides with that of the top surface of the wiring board material WB'. Therefore, as shown in FIG. 12(k), by merely peeling the support sheet 10 from the laminate LB, the laminate LB can be manufactured, in which the heights of the top and lower surfaces of each of the columnar metal members 14 coincide with those of the top and lower surfaces of the wiring board material WB'.

Subsequently, as shown in FIG. 12(l), another metal layer 20' is provided on each of both the upper and lower surfaces by plating and the like. By pattern-forming this by etching and the like, as shown in FIG. 12(m), a wiring board can be manufactured, which includes a wiring board WB having a wiring pattern, a columnar metal member 14 positioned in the opening, and a thermosetting resin 17 filled and cured between the inner surface of the opening and the columnar metal member 14.

DESCRIPTION OF REFERENCE SIGNS

2 Adhesive layer
10 Metal plate
14 Columnar metal member
16 Insulating layer
16' Prepreg
16a Opening
17 Thermosetting resin
19 Insulating layer
19' Insulating layer (wiring board material)
19a Opening
20 Wiring pattern
20' Metal layer (wiring board material)
20a Opening
21 Mask material
21a Opening
30 Plated through hole
A Convex portion
WB Wiring board
WB' Wiring board material
LM Laminate material
LB Laminate

What is claimed is:

1. A method for manufacturing a wiring board or a wiring board material, the method comprising the steps of:
preparing a laminate material including a support sheet, a plurality of columnar metal members on the support sheet, and a wiring board or a wiring board material having a plurality of openings in portions corresponding to the columnar metal members such that the columnar metal members are positioned in the respective openings, and a resin film which adheres to a surface of the wiring board or the wiring board material and has a plurality of openings in portions corresponding to the columnar metal members;
obtaining a laminate including a thermosetting resin filled and cured between an inner surface of each of the openings of the wiring board or the wiring board material and each of the columnar metal members; and
peeling at least the support sheet and the resin film from the laminate.

2. The method for manufacturing a wiring board or a wiring board material according to claim 1, wherein a plated through hole is formed in each of the openings of the wiring board or the wiring board material.

* * * * *